United States Patent
Choi et al.

(10) Patent No.: US 6,751,270 B1
(45) Date of Patent: Jun. 15, 2004

(54) CARRIER FREQUENCY RECOVERY APPARATUS CAPABLE OF SIMULTANEOUSLY REDUCING FREQUENCY OFFSET AND PHASE ERROR AND METHOD OF THE SAME

(75) Inventors: Han-Jun Choi, Ichon (KR); Duck-Myung Lee, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 686 days.

(21) Appl. No.: 09/604,054

(22) Filed: Jun. 26, 2000

(30) Foreign Application Priority Data

Jun. 24, 1999 (KR) .......................................... 1999-23981

(51) Int. Cl.[7] .............................. H04L 27/22; H03D 3/24
(52) U.S. Cl. ......................... 375/326; 375/344; 375/376
(58) Field of Search ................................. 375/293, 294, 375/326, 327, 344, 354, 362, 371, 373, 375, 376; 455/182.1, 182.2, 192.1, 192.2, 192.3, 260; 331/1 A, 1 R, 18, 35; 329/307

(56) References Cited

U.S. PATENT DOCUMENTS

| | | | | |
|---|---|---|---|---|
| 3,909,735 A | * | 9/1975 | Anderson et al. ............. 331/10 |
| 4,243,941 A | * | 1/1981 | Zdunek ....................... 329/309 |
| 5,440,587 A | * | 8/1995 | Ishikawa et al. ............. 375/332 |
| 5,727,027 A | | 3/1998 | Tsuda ......................... 375/329 |
| 5,739,727 A | * | 4/1998 | Lofter et al. ................. 331/11 |
| 5,740,205 A | | 4/1998 | Baum et al. ................. 375/344 |
| 5,812,614 A | | 9/1998 | Baum et al. ................. 375/344 |
| 5,812,615 A | | 9/1998 | Baum et al. ................. 375/344 |
| 6,097,777 A | * | 8/2000 | Tateishi et al. .............. 375/376 |
| 6,211,741 B1 | * | 4/2001 | Dalmia ......................... 331/11 |
| 6,236,343 B1 | * | 5/2001 | Patapoutian ................. 341/111 |

FOREIGN PATENT DOCUMENTS

| JP | 3-153145 | 7/1991 | .......... H04L/27/22 |
| JP | 10243042 | 11/1998 | .......... H04L/27/38 |

OTHER PUBLICATIONS

Bergmans, J.W.M., "Effect of loop Delay on Stability of Discrete-Time PLL", IEEE Transactions on Circuits and Systems-I:Fundamental Theory and Applications, vol. 42, No. 4,. pp. 229–231, Apr. 1995.*

* cited by examiner

Primary Examiner—Chieh M. Fan
(74) Attorney, Agent, or Firm—Jacobson Holman PLLC

(57) ABSTRACT

A carrier frequency recovery apparatus for simultaneously reducing a frequency offset and a phase error includes: a phase detector for estimating phase error of an I-channel and Q-channel signals having a frequency offset; a select signal generator for receiving the phase error and generating a select signal; a first loop filter for attenuating the phase error by a predetermined range; a second loop filter for attenuating the phase error in a range narrower than the first loop filter; an addition unit for adding the output value of the first loop filter to an output value of the second loop filter; a multiplexer for selectively outputting an output value of the first loop filter or an output value of the addition unit in response to the select signal; and a voltage-controlled oscillator block for storing and outputting cosine and sine signals corresponding to an output value of the multiplexer.

13 Claims, 5 Drawing Sheets

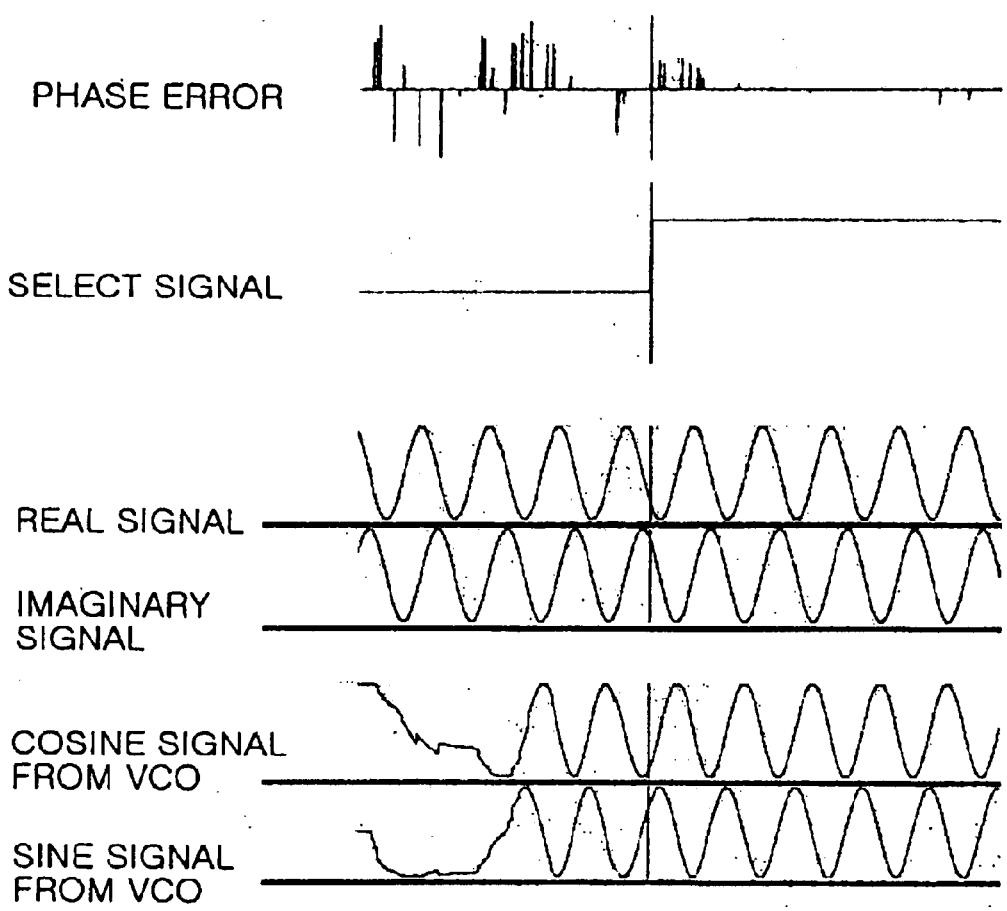

CARRIER FREQUENCY RECOVERY APPARATUS CAPABLE OF SIMULTANEOUSLY REDUCING FREQUENCY OFFSET AND PHASE ERROR AND METHOD OF THE SAME

FIELD OF THE INVENTION

The present invention relates to a communication device; and, more particularly, to a carrier frequency recovery apparatus capable of simultaneously reducing frequency offset and phase error.

DESCRIPTION OF THE PRIOR ART

In a typical coherent digital communication system including a transmitter and a receiver, the transmitter modulates a data by using a carrier frequency and transmits a modulated data to the receiver. At the receiver, the modulated data as a received signal is demodulated to extract the data by carrying out a carrier frequency recovery operation. At this time, whether it is possible to extract data or not depends on the carrier frequency recovery, so that the carrier frequency recovery is very important regardless of data error.

A conventional carrier frequency recovery circuit including a PLL (phase locked loop) structure carries out a carrier frequency recovery operation by gradually reducing a phase difference between a received signal and an output signal from a VCO (voltage controlled oscillator), until the phase difference therebetween becomes below a predetermined value.

In such a carrier frequency recovery circuit, a first assumption is that a frequency difference between the received signal and the signal outputted from the VCO is not large, and additional circuits need to be added in order for this. A second assumption is that a phase rotation error may occur due to a phase noise even after recovering the carrier frequency, i.e., after obtaining a locked phase.

The conventional carrier frequency recovery circuit employs a scheme that covers only a carrier phase. In that case, however, an automatic frequency control (AFC) unit is used to reduce a frequency offset of a signal outputted from the carrier frequency recovery circuit. For example, in case where a signal from the carrier frequency recovery circuit has a frequency offset of 100 kHz or more, the AFC unit reduces the frequency offset of the signal to a predetermined value until the carrier phase can be recovered. At this time, the AFC unit is generally constituted with differentiators, multipliers, adders and the like, so that a chip size is increased.

SUMMARY OF THE INVENTION

It is, therefore, an object of the present invention to provide a carrier frequency recovery circuit for simultaneously reducing a frequency offset and a phase error without using an AFC unit.

In accordance with an aspect of the present invention, there is provided a carrier frequency recovery apparatus for simultaneously reducing a frequency offset and a phase error, comprising: a phase detection means for estimating a phase error of an I-channel and Q-channel signals having a frequency offset; a select signal generating means for receiving the phase error and generating a select signal; a first loop filter means for attenuating the phase error by a predetermined range; a second loop filter means for attenuating the phase error in a range narrower than the first loop filter means; an addition means for adding the output value of the first loop filter means to an output value of the second loop filter means; a multiplexing means for selectively outputting an output value of the first loop filter means or an output value of the addition means in response to the select signal; and a voltage-controlled oscillation means for storing and outputting cosine and sine signals corresponding to an output value of the multiplexing means, wherein the cosine and sine signals are used to correct the frequency offset of the I-channel and Q-channel signals.

In accordance with another aspect of the present invention, there is provided a method for simultaneously reducing a frequency offset and a phase error, comprising the steps of: a) estimating a phase error of an I-channel and Q-channel signals having a predetermined frequency offset; b) attenuating the phase error by a first range; c) outputting cosine and sine signals corresponding to an attenuating phase error; d) correcting the I-channel and Q-channel signals by using the cosine and sine signals; e) repeating the steps a) to d) until a select signal is enabled; f) if the select signal is enabled, attenuating a phase error of a corrected I-channel and Q-channel signals by a second range narrower than the first range; g) outputting cosine and sine signals corresponding to the attenuated phase error; h) correcting the I-channel and Q-channel signals; and i) repeating the steps f) to h) until the select signal is disabled.

BRIEF DESCRIPTION OF THE DRAWINGS

Other objects and aspects of the invention will become apparent from the following description of the embodiments with reference to the accompanying drawings, in which:

FIG. 4 is a diagram showing a simulation result according to the present invention.

DETAILED DESCRIPTION OF THE PREFERRED EMBODIMENTS

Figure 1:
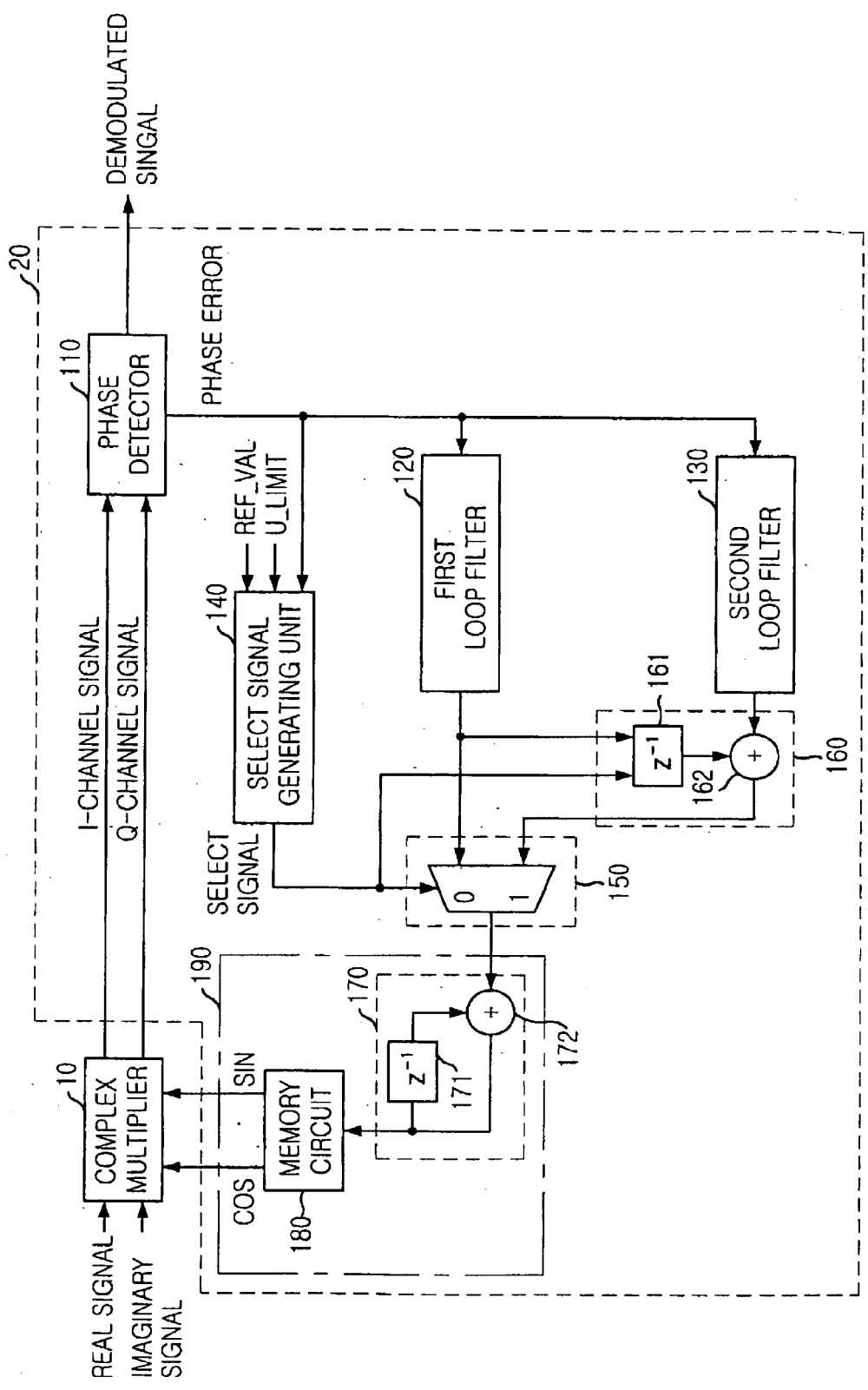
FIG. 1 is a schematic block diagram illustrating a carrier frequency recovery circuit in accordance with the present invention.

FIG. 1 is a block diagram illustrating a carrier frequency recovery circuit in accordance with the present invention. a reference numeral 10 represents a complex multiplier and a reference numeral 20 represents a carrier frequency recovery circuit.

As shown, the complex multiplier 10 retrieves a received signal divided into a real signal and an imaginary signal at a previous stage (not shown). Then, the complex multiplier 10 multiplies the real and imaginary signals by cosine and sine signals, to thereby produce an in-phase component signal (hereinafter, I-channel signal) and a quadrature component signal (hereinafter, Q-channel signal).

A phase detector 110 receives the I-channel and Q-channel signals from the complex multiplier 100 and estimates a phase error of the I-channel and Q-channel signals having a predetermined frequency offset.

A first loop filter 120 has a wide bandwidth, so that the first loop filter 120 attenuates the phase error by a wide range.

A second loop filter 130 has a narrow bandwidth compared with the first loop filter 120, so that the second loop filter 130 attenuates the phase error by a narrow range.

A select signal generating unit 140 receives the estimated phase error from the phase detector 110, a first reference value REF_VAL and a second reference value U_LIMIT from an external circuit, to generate a select signal.

An addition unit 160 includes a delaying unit 161 and an adder 162. The delaying unit 161 delays an output value of the first loop filter 120 for a predetermined time in response to the select signal. The delaying unit 161 serves to store the output signal of the first loop filter 120 for a predetermined time. The adder 162 adds the output value of the delaying unit 161 to the output value of the second loop filter 130.

A multiplexer 150 selectively outputs the output value from the first loop filter 120 and the output value from the addition unit 160 in response to the select signal.

A VCO 190 includes a phase accumulation unit 170 and a memory circuit 180. The phase accumulation unit 170 including a delaying unit 171 and an adder 172 accumulates a value outputted from the multiplexer 150 with a previous value. The memory circuit 180 outputs cosine and sine signals corresponding to a value, outputted from the phase accumulation unit 170, to the complex multiplier 10.

Although a carrier frequency recovery circuit including two loop filters is described as an embodiment of the present invention, it is preferably possible to implement the carrier frequency recovery circuit having more than two loop filters having different bandwidths and different attenuation characteristics from each other.

Figure 2:
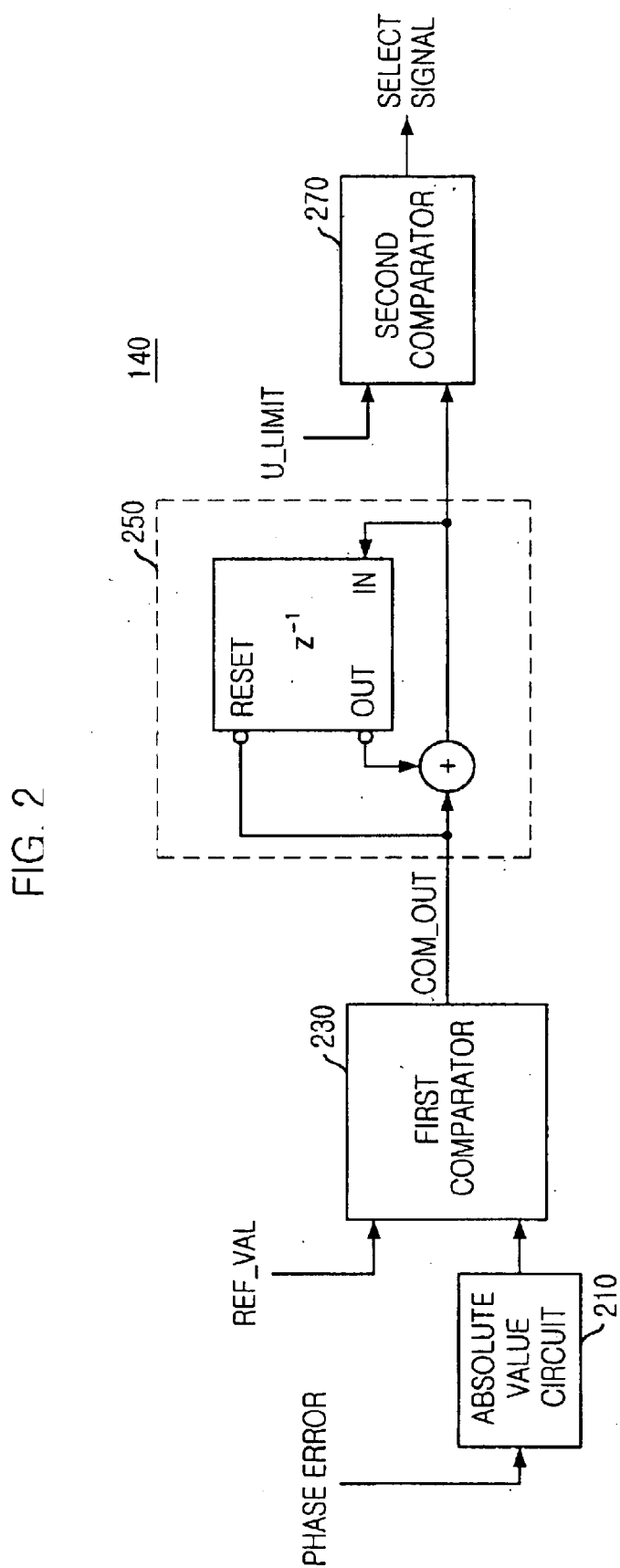
FIG. 2 is a schematic block diagram illustrating a select signal generating unit shown in FIG. 1.
Figure 3A:
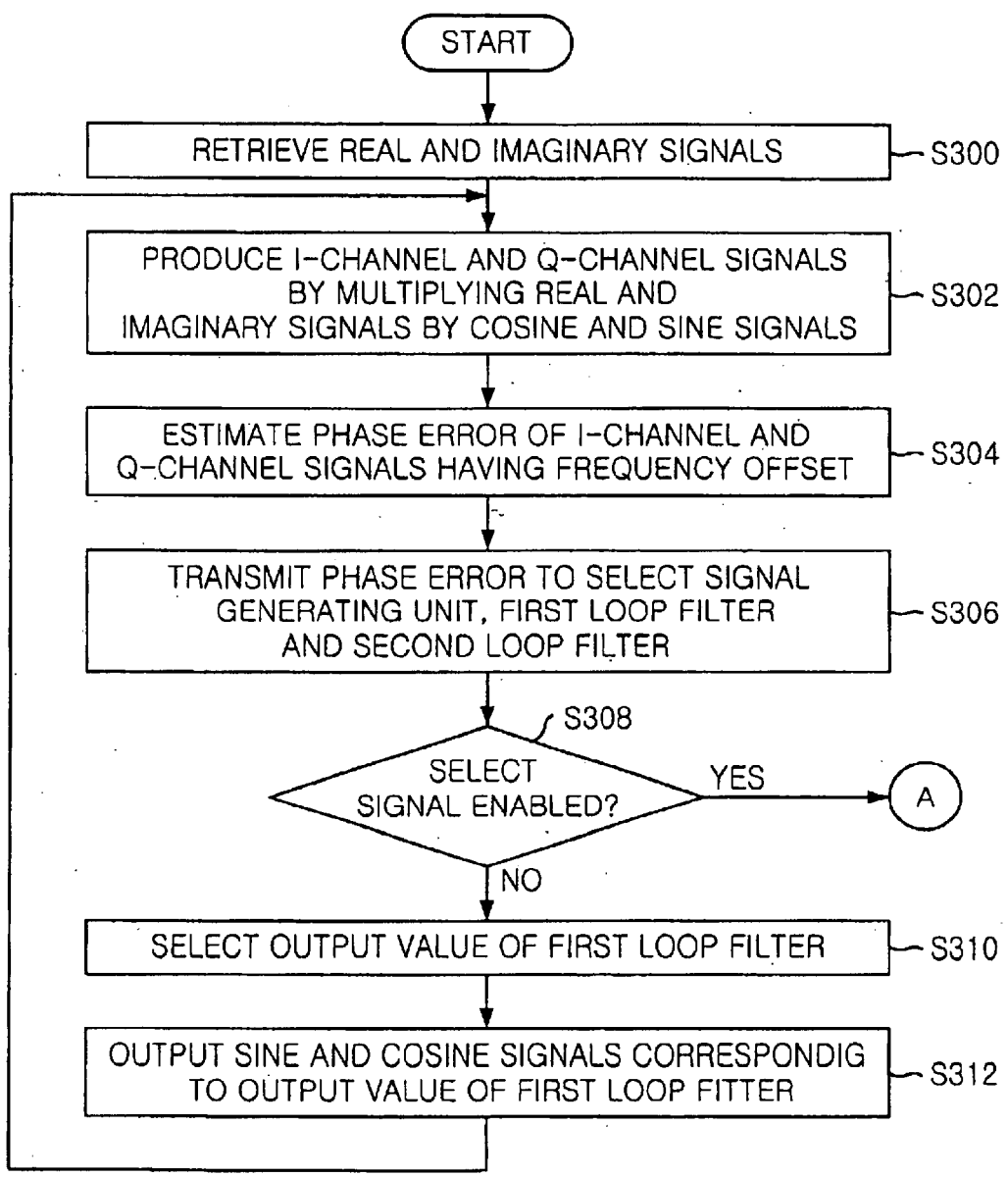
FIGS. 3A and 3B are flow charts illustrating a method for simultaneously reducing a frequency offset and a phase error in accordance with present invention.
Figure 3B:
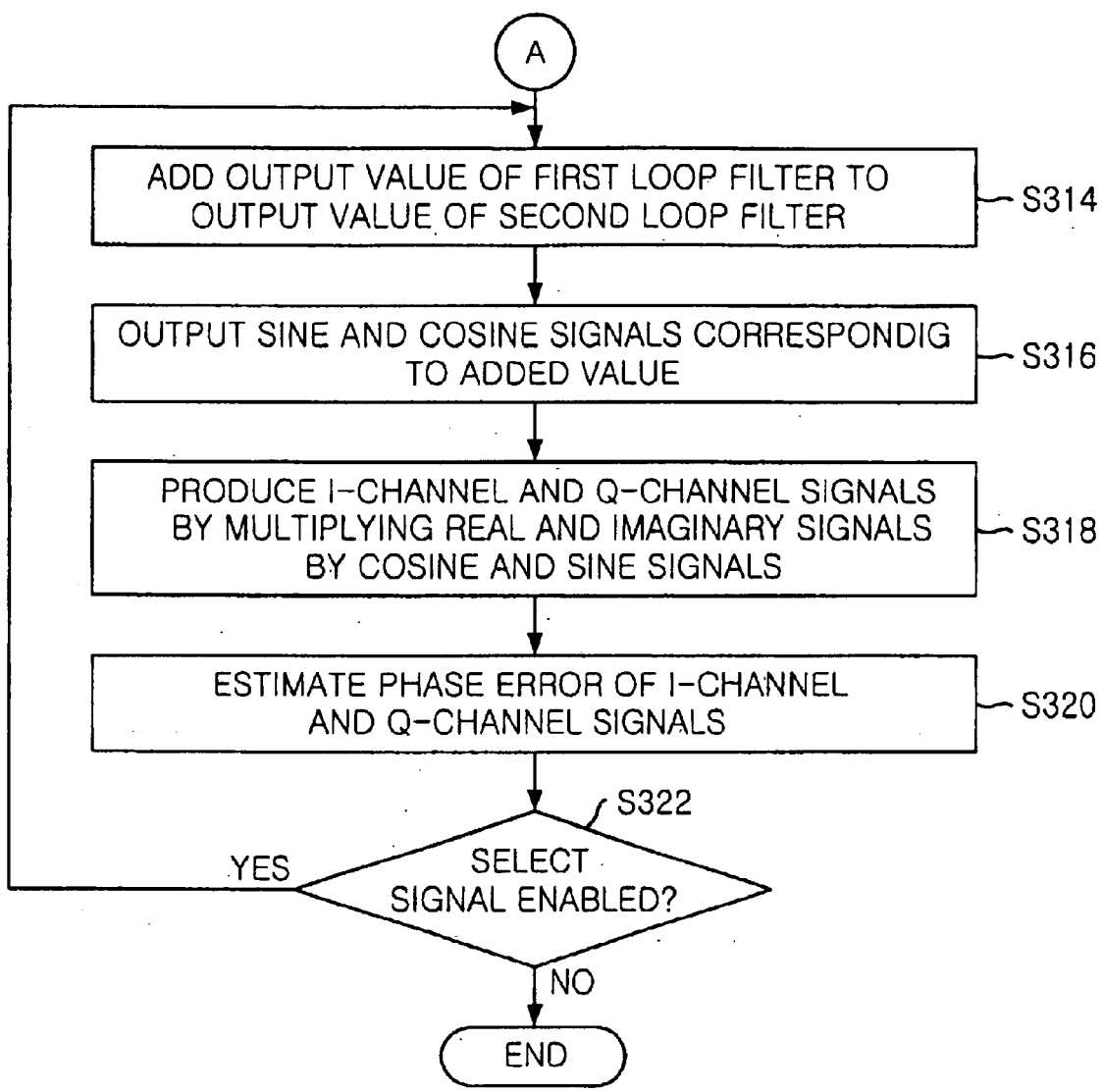

FIG. 2 is a block diagram illustrating the select signal generating unit 140 shown in FIG. 1.

As shown, the select signal generating unit 140 includes an absolute value circuit 210, a first comparator 230, an accumulator 250, and a second comparator 270.

The absolute value circuit 210 receives the phase error from the phase detector 110, shown in FIG. 1, to generate an absolute value of the phase error.

The first comparator 230 compares the absolute value with a first reference value REF_VAL to determine whether the absolute value is greater than the first reference value REF_VAL. As a comparison result, if the first reference value REF_VAL is greater than the absolute value, the first comparator 230 enables a control signal COM_OUT.

The accumulator 250 increases a count value one by one in case where the control signal COM_OUT is continuously enabled. On the other hand, the accumulator 250 resets a count value to an initial value, e.g., zero, in case where the control signal COM_OUT is disabled.

The second comparator 270 compares the count value from the accumulator 250 with a second reference value U_LIMIT to determine whether the count value is greater than the second reference value U_LIMIT. As a comparison result, if the count value is greater than the second reference value U_LIMIT, the second comparator 270 enables the select signal.

At this time, the first reference value REF_VAL and the second reference value U_LIMIT are stored in registers. Additionally, the reference values are also programmable. That is, a user can change the reference values by programming, so that the carrier frequency recovery operation is achieved changing characteristics of the first and second loop filters 120 and 130.

Hereinafter, a method for simultaneously reducing a frequency offset and a phase error will be described in detail with reference to FIGS. 1, 2, 3A and 3B.

At step S300, the complex multiplier 10 retrieves the received data divided into a real signal and an imaginary signal.

At step S302, the complex multiplier 10 produces an I-channel signal and a Q-channel signal by multiplying the real signal and the imaginary signal by a cosine signal and a sine signal.

At step S304, the phase detector 110 estimates a phase error of the I-channel and Q-channel signals having a frequency offset of, e.g., approximately 100 kHz.

At step S306, the phase error is transmitted to the select signal generating unit 140, the first loop filter 120 and the second loop filter 130. At this time, the first loop filter 120 having a wide bandwidth attenuates the phase error by a wide range to produce a corrected phase error having a reduced frequency offset.

At step S308, whether the select signal is enabled or not is determined by comparing an absolute value of the phase error with the first reference value REF_VAL and the second reference value U_LIMIT. At this time, in case where the absolute value of the phase error is smaller than the first reference value REF_VAL or in case where the count value is smaller than the second reference value U_LIMIT, the select signal is disabled to a low level, wherein the count value is a value accumulated in the accumulator 250 when a corrected phase error is greater than the first reference value REF_VAL. On the other hand, in case where the count value is greater than the second reference value U_LIMIT, the select signal is enabled to a high level.

At step S310, in case where the select signal is disabled, the multiplexer 150 selects and outputs an output value of the first loop filter 120 in response to the select signal. The first loop filter 120 having a wide bandwidth attenuates the phase error in a wide range.

At step S312, the output value of the multiplexer 150 is transmitted to the VCO 190. The output value of the multiplexer 150 is accumulated with a previous value in the phase accumulator 170 and then the memory circuit 180 outputs cosine and sine signals corresponding to the accumulated value.

After the step S312, the step S302 is again carried out. That is, a corrected I-channel and Q-channel signals are produced by using the cosine and sine signals corresponding to the corrected phase error. Then, the steps S304 to S308 are carried out.

At the step S308, the steps S310, S312, and S300 to S306 are repeated until the select signal is enabled.

At step S308, if the select signal is enabled, step S314 is carried out. At the step S314, the multiplexer 150 selects and outputs an added value from the addition unit 160. At this time, the added value is obtained by adding a final value of the first loop filter 120 to an output value of the second loop filter 130. Additionally, the second loop filter 130 having a narrow bandwidth finely attenuates the phase error by a narrow range compared with the first loop filter 120.

At step S316, the added value is transmitted to the VCO 190, so that the added value is accumulated with a previous value in the phase accumulator 170 and then cosine and sine signals corresponding the accumulated value are outputted.

At step S318, in the same manner as the step S302, corrected I-channel and Q-channel signals are produced by multiplying the real signal and the imaginary signal by the cosine and sine signals outputted from the memory circuit 180 of the VCO 190.

At step S320, phase error of the corrected I-channel and Q-channel signals are estimated.

At step S322, whether the select signal is still enabled is determined. The steps S314 to S320 are repeated while the select signal is enabled. In case where the select signal is disabled, the carrier frequency recovery operation is completed.

FIG. 4 is a diagram illustrating a simulation result of signals in FIG. 1, when a received signal has a frequency offset of 100 kHz and a phase error of 30 degree.

As can be seen, at a point where the select signal is enabled to a high level, the output signal from the VCO is compensated with respect to the frequency offset and the phase noise.

As a result, by implementing the carrier frequency recovery circuit with two loop filters that have different bandwidths and different attenuation characteristics from each other, the frequency offset and the phase error can be reduced without using the AFC unit. Therefore, a chip size is remarkably reduced and the structure is simplified. Additionally, a stable carrier frequency recovery is achieved.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A carrier frequency recovery apparatus for simultaneously reducing a frequency offset and a phase error, comprising:

a phase detection means for estimating a phase error of an I-channel and Q-channel signals having a frequency offset;

a select signal generating means for receiving the phase error and generating a select signal;

a first loop filter means for attenuating the phase error by a predetermined range;

a second loop filter means for attenuating the phase error in a range narrower than the first loop filter means;

an addition means for adding an output value of the first loop filter means to an output value of the second loop filter means;

a multiplexing means for selectively outputting the output value of the first loop filter means or an output value of the addition means in response to the select signal; and a voltage-controlled oscillation means for storing and outputting cosine and sine signals corresponding to an output value of the multiplexing means, wherein the cosine and sine signals are used to correct the frequency offset of the I-channel and Q-channel signals.

2. The carrier frequency recovery apparatus as recited in claim 1, wherein the select signal generating means includes:

an absolute value generating means for receiving the phase error to output an absolute value of the phase error;

a first comparing means for comparing the absolute value of the phase error with a first reference value to generate a control signal;

an accumulation means for increasing a count value in response to the control signal; and a second comparing means for comparing the count value from the accumulation means with a second reference value, to output the select signal.

3. The carrier frequency recovery apparatus as recited in claim 2, wherein the first reference value and the second reference value are stored in a register and programmable.

4. The carrier frequency recovery apparatus as recited in claim 2, wherein, in case where the select signal is disabled, the multiplexing means selects and outputs the output value of the first loop filter means in response to the select signal.

5. The carrier frequency recovery apparatus as recited in claim 4, wherein, in case where the select signal is enabled, the multiplexing means selects and outputs the output value of the addition means in response to the select signal.

6. The carrier frequency recovery apparatus as recited in claim 1, wherein the addition means includes:

a delaying means for delaying the output value of the first loop filter; and an adder means for adding a delayed value from the delaying means to the output value of the second loop filter.

7. The carrier frequency recovery apparatus as recited in claim 1, wherein the voltage-controlled oscillation means includes:

a phase accumulating means for accumulating the output value from the multiplexing means; and a storage means for storing and outputting cosine and sine signals corresponding to a value outputted from the phase accumulating means.

8. A method for simultaneously reducing a frequency offset and a phase error, comprising the steps of:

a) estimating a phase error of an I-channel and Q-channel signals having a predetermined frequency offset;

b) attenuating the phase error by a first range;

c) outputting cosine and sine signals corresponding to an attenuating phase error from the step b);

d) correcting the I-channel and Q-channel signals by using the cosine and sine signals from the step c);

e) repeating the steps a) to d) until a select signal is enabled;

f) if the select signal is enabled, attenuating a phase error of a corrected I-channel and Q-channel signals by a second range narrower than the first range;

g) outputting cosine and sine signals corresponding to the attenuated phase error from the step f);

h) correcting the I-channel and Q-channel signals by using the cosine and sine signals from the step g); and i) repeating the steps f) to h) until the select signal is disabled, wherein the step f) includes the steps of:

f1) attenuating the phase error by the second range;

f2) adding a final phase error obtained at the step e) to the phase error attenuated by the second range; and f3) outputting an added phase error.

9. The method as recited in claim 8, wherein the step c) further includes a step of accumulating the attenuated phase error obtained at the step b) with a previously accumulated value.

10. The method as recited in claim 8, wherein the step g) further includes a step of accumulating the added phase error from the step f3) with a previously accumulated value.

11. The method as recited in claim 10, wherein whether the select signal is enabled or not is determined by steps of:

j) calculating an absolute value of the phase error from the step a);

k) comparing the absolute value with a first reference value;

l) if the first reference value is greater than the absolute value, increasing a count value in response to a control signal;

m) comparing the count value with a second reference value;

n) if the count value is greater than the second reference value, enabling the select signal.

12. The method as recited in claim 11, wherein, at the step l), if the first reference value is smaller than the absolute value, disabling the control signal to reset the count value to an initial value, so that the select signal is disabled.

13. The method as recited in claim 12, wherein the first and second reference values are stored in a register and programmable.

* * * * *